United States Patent
Bain

(10) Patent No.: US 7,320,101 B1
(45) Date of Patent: Jan. 15, 2008

(54) FAST PARALLEL CALCULATION OF CYCLIC REDUNDANCY CHECKS

(75) Inventor: Peter Bain, Ottawa (CA)

(73) Assignee: Altera Corporation, San Jose, CA (US)

( * ) Notice: Subject to any disclaimer, the term of this patent is extended or adjusted under 35 U.S.C. 154(b) by 392 days.

(21) Appl. No.: 10/644,223

(22) Filed: Aug. 19, 2003

(51) Int. Cl.
*H03M 13/09* (2006.01)

(52) U.S. Cl. .................... 714/781; 714/807

(58) Field of Classification Search ............. 714/781, 714/807
See application file for complete search history.

(56) References Cited

U.S. PATENT DOCUMENTS

| | | | | |
|---|---|---|---|---|
| 3,634,883 A | * | 1/1972 | Kreidermacher | 712/234 |
| 3,798,597 A | * | 3/1974 | Frambs et al. | 714/781 |
| 3,943,347 A | * | 3/1976 | Martinson | 713/600 |
| 4,151,565 A | * | 4/1979 | Mazzola | 360/40 |
| 4,215,335 A | * | 7/1980 | Doi et al. | 714/701 |
| 4,410,989 A | * | 10/1983 | Berlekamp | 714/762 |
| 4,455,629 A | * | 6/1984 | Suzuki et al. | 365/230.06 |
| 4,520,463 A | * | 5/1985 | Okumura | 365/230.06 |
| 4,566,105 A | * | 1/1986 | Oisel et al. | 714/756 |
| 4,598,403 A | * | 7/1986 | Odaka | 714/756 |
| 4,604,749 A | * | 8/1986 | Shinoda et al. | 714/773 |
| 4,763,332 A | * | 8/1988 | Glover | 714/756 |
| 4,928,280 A | * | 5/1990 | Nielson et al. | 714/762 |
| 4,937,828 A | * | 6/1990 | Shih et al. | 714/757 |
| 5,130,991 A | * | 7/1992 | Takano | 714/757 |
| 5,267,249 A | * | 11/1993 | Dong | 714/775 |
| 5,313,530 A | * | 5/1994 | Iwamura | 380/28 |
| 5,325,372 A | * | 6/1994 | Ish-Shalom | 714/757 |
| 5,345,451 A | * | 9/1994 | Uriu et al. | 714/775 |
| 5,367,544 A | * | 11/1994 | Bruekheimer | 375/368 |
| 5,375,127 A | * | 12/1994 | Leak et al. | 714/772 |
| 5,408,476 A | * | 4/1995 | Kawai et al. | 714/775 |
| 5,671,237 A | * | 9/1997 | Zook | 714/755 |
| 5,703,887 A | * | 12/1997 | Heegard et al. | 714/775 |
| 5,748,652 A | * | 5/1998 | Kim | 714/807 |
| 5,771,249 A | * | 6/1998 | Yanagisawa | 714/798 |
| 5,844,923 A | * | 12/1998 | Condon | 714/798 |
| 5,878,057 A | * | 3/1999 | Maa | 714/757 |
| 6,029,186 A | * | 2/2000 | DesJardins et al. | 708/492 |
| 6,049,903 A | * | 4/2000 | Nishimura | 714/752 |
| 6,195,780 B1 | * | 2/2001 | Dravida et al. | 714/758 |
| 6,427,219 B1 | * | 7/2002 | Yang | 714/758 |
| 6,519,738 B1 | * | 2/2003 | Derby | 714/781 |
| 6,530,057 B1 | * | 3/2003 | Kimmitt | 714/758 |
| 6,684,363 B1 | * | 1/2004 | Cassiday et al. | 714/776 |
| 6,820,232 B2 | * | 11/2004 | Kim et al. | 714/781 |
| 6,928,608 B2 | * | 8/2005 | Peyser et al. | 714/807 |
| 6,931,581 B1 | * | 8/2005 | Cassiday et al. | 714/758 |
| 7,216,285 B2 | * | 5/2007 | Chen | 714/781 |
| 7,219,293 B2 | * | 5/2007 | Tsai et al. | 714/757 |
| 2002/0144208 A1 | * | 10/2002 | Gallezot et al. | 714/781 |
| 2003/0200500 A1 | * | 10/2003 | Weissinger | 714/785 |

OTHER PUBLICATIONS

Derby, J., "High-Speed CRC Computation Using State-Space Transformations" 2001 GLOBECOM, Nov. 2001, pp. 166-170.*

* cited by examiner

*Primary Examiner*—Stephen M. Baker
(74) *Attorney, Agent, or Firm*—Townsend and Townsend and Crew LLP

(57) ABSTRACT

Circuits, methods, and apparatus for the fast parallel calculation of CRCs. One embodiment provides a feedforward path that combines common terms to simplify input logic. Common expressions that appear in multiple terms in the feedforward path are implemented using logic gates that are shared by the multiple terms, thereby reducing logic complexity, fan-out, and gate delay. Another embodiment provides a CRC logic architecture having a feedback path that is able to use more than one clock cycle in its computation.

18 Claims, 15 Drawing Sheets

$$X^g(W_1\,W_2\,W_3) \bmod G = X^g(W_1 \cdot X^{2W} + W_2 \cdot X^W + W_3) \bmod G \quad \sim 500$$

$$(W_1 \cdot X^{2W} + Z \cdot X^W + Z) \bmod G \quad \sim 505$$

$$(Z \cdot X^{2W} + W_2 \cdot X^W + Z) \bmod G \quad \sim 510$$

$$\underline{(Z \cdot X^{2W} + Z \cdot X^W + W_3) \bmod G} \quad \sim 515$$
$$(W_1 \cdot X^{2W} + W_2 \cdot X^W + W_3) \bmod G \quad \sim 520$$

$$= (W_1\,W_2\,W_3) \bmod G \quad \sim 522$$

IF: $(W_1) \bmod G = S_1 \quad \sim 530$
$(W_2) \bmod G = S_2 \quad \sim 540$
$(W_3) \bmod G = S_3 \quad \sim 550$ THEN: $(S_1 \cdot X^{2W} + S_2 \cdot X^W + S_3) \bmod G \quad \sim 560$ $= (W_1 \cdot X^{2W} + W_2 \cdot X^W + W_3) \bmod G \quad \sim 565$ So: $(S_1 \cdot X^{2W} + Z \cdot X^W + Z) \bmod G \quad \sim 570$ $(Z \cdot X^{2W} + S_2 \cdot X^W + Z) \bmod G \quad \sim 575$ $\underline{(Z \cdot X^{2W} + Z \cdot X^W + S_3) \bmod G} \quad \sim 580$
$(W_1 \cdot X^{2W} + W_2 \cdot X^W + W_3) \bmod G \quad \sim 590$ $= (W_1\,W_2\,W_3) \bmod G \quad \sim 595$

FIG. 5

$$X^g(W_1\ W_2\ W_3)\bmod G = X^g(W_1 \cdot X^{2W} + W_2 \cdot X^W + W_3) \bmod G$$

$$(W_1 \cdot X^{2W} + Z \cdot X^W + W_3) \bmod G \sim 1015 \qquad 1010$$

$$\frac{(Z \cdot X^{2W} + W_2 \cdot X^W + Z) \bmod G \sim 1020}{(W_1 \cdot X^{2W} + W_2 \cdot X^W + W_3) \bmod G \sim 1025}$$

IF: $(W_1) \bmod G = S_1 \sim 1030$ $(W_2) \bmod G = S_2 \sim 1035$ $(W_3) \bmod G = S_3 \sim 1040$ THEN: $(S_1 \cdot X^{2W} + Z \cdot X^W + S_2) \bmod G \sim 1045$ $$\frac{(Z \cdot X^{2W} + S_2 \cdot X^W + Z) \bmod G \sim 1050}{(W_1 \cdot X^{2W} + W_2 \cdot X^W + W_3) \bmod G \sim 1055}$$

$= (W_1\ W_2\ W_3) \bmod G \sim 1060$

FIG. 10

FAST PARALLEL CALCULATION OF CYCLIC REDUNDANCY CHECKS

BACKGROUND

The present invention is related to error detection in data transmission systems, and particularly to the fast parallel calculation of cyclic redundancy checks (CRCs).

The purpose of error detection systems is to detect whether data messages are corrupted during transmission. If the presence of one or more errors is detected in a received data message, the data message can either be ignored, for example in voice and video applications, a retransmission can be requested, for example in Ethernet, Sonet, Hyperlan, and other types of data communication systems, or the error can be corrected, as in forward error correction systems. Being able to detect errors, whether or not the errors are corrected, means that the introduction of errors does not have the same implication as if the errors go undetected, that is, it is not as important to avoid the occurrence of errors if they can be detected. This allows data network systems to be designed such that errors are allowed to occur, typically so long as they occur at or below a known manageable rate. The result is that data can be transmitted at a lower power level and at higher transmission rates. Because of this, data can be transmitted farther and channel capacity can be increased.

Modern data networks transmit data at ever higher data rates, thus received data needs to be processed quickly. Accordingly, the trend in cyclical redundancy checking is to process more bits of data simultaneously. This means that new data network protocols use longer polynomials in the processing of the CRCs, as described below.

But these longer polynomial expressions require increasingly complex circuitry to generate and verify these CRCs. Increasingly complex circuitry consumes more power and has longer delay paths and higher fan-outs that result in slower operation. For example, a 32 bit polynomial may require 32 circuits having on the order of 32 inputs each, for over 900 total logic gate inputs.

Thus what is needed are circuits, methods, and apparatus for rapidly handling these longer polynomials without greatly increasing the complexity of the circuitry required to process them.

SUMMARY

Accordingly, embodiments of the present invention provide circuits, methods, and apparatus for the fast parallel calculation of CRCs. One embodiment provides a feedforward path that combines common terms to simplify input logic. Specifically, common expressions appear in multiple terms in the feedforward path are implemented using logic gates that are shared by the multiple terms, thereby reducing logic complexity, fan-out, and gate delay.

Another embodiment provides a CRC logic architecture having a feedback path that is able to use more than one clock cycle in its computation. By providing the feedback path more than one clock cycle, this architecture relieves a severe timing requirement.

A better understanding of the nature and advantages of the present invention may be gained with reference to the following detailed description and the accompanying drawings.

BRIEF DESCRIPTION OF THE DRAWINGS

FIG. 5 illustrates several equations showing the underlying basis for a method of computing CRCs that may incorporate feedforward elements of embodiments of the present invention;

FIG. 10 illustrates several equations showing the underlying basis for a method of computing CRCs that may incorporate embodiments of the present invention;

DESCRIPTION OF EXEMPLARY EMBODIMENTS

Figure 1:
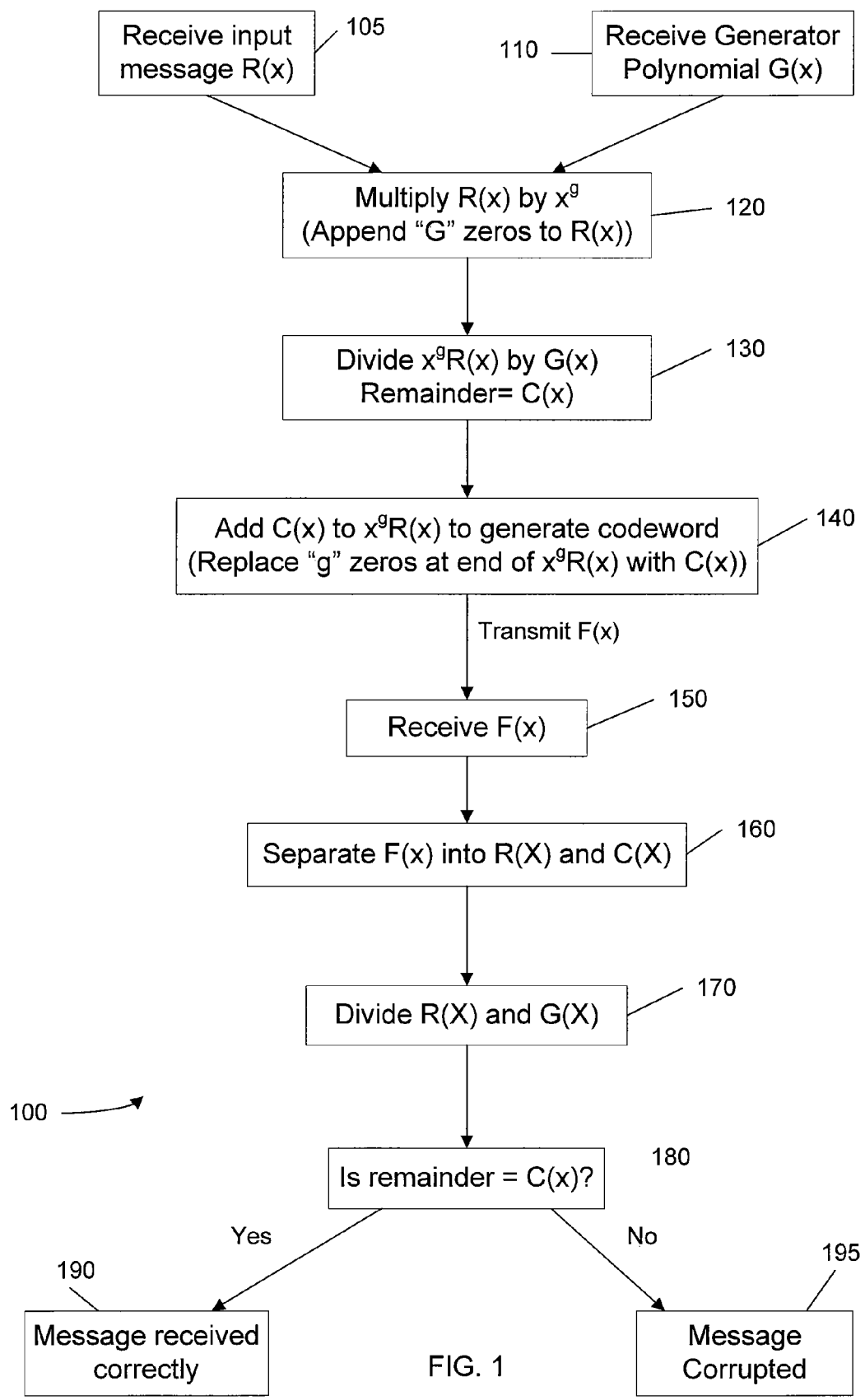
FIG. 1 is a flow chart of a method of transmitting and receiving signals that benefits by incorporation of embodiments of the present invention.

FIG. 1 is a flow chart of a method of transmitting and receiving signals that benefits by incorporation of embodiments of the present invention. This figure, as with all the included figures, is shown for exemplary purposes only and does not limit either the possible embodiments of the present invention or claims.

In act 105, an input message R(x) is received by a CRC circuit. This message may be received by a transmitter that is consistent with Ethernet, Hypertransport, Sonet, or other protocol. In act 110, a generator polynomial G(x) is received. This polynomial is typically preselected based on the communications protocol being used. These generator polynomials are designed specifically to increase the detection of various types of errors that may occur.

In act 120, the received message is multiplied by $x^g$, where x is a zero word and g is equal to the order of the generator polynomial G(X). The result of this is that a "g" number of zeros is appended to the received message. In act 130, this product is divided by the generator polynomial, resulting in a quotient which may be ignored, and a remainder or syndrome. In act 140, this syndrome is added to the value determined in act 120 to generate a codeword. In short, the "g" number of zeros that had been appended to the message are replaced by the syndrome C(x). This sum is a codeword which may be transmitted. In various embodiments of the present invention, other acts, such as interleaving, may be done before the codeword is sent.

In act 150, the codeword is received. The codeword is typically received by a receiver that is separate from the transmitter used to transmit the codeword, and is designed to be compliant with the same protocol as the transmitter.

In act 160, the codeword is separated into message and remainder portions. In act 170, the message is divided by the same generator polynomial G(X) that the receiver used to generate the remainder. In act 180, it is determined whether the newly calculated remainder is equal to the remainder or syndrome that was transmitted as part of the codeword.

If the newly calculated remainder does not match the received syndrome, it is determined that the message has been corrupted in act 195. In this case, either the message can be ignored, for instance in voice and video transmissions, or a request that data be resent can be made, for instance in data communication systems.

If the newly calculated remainder and C(x) are equal, it is assumed the message was received correctly in act 190. While this is typically true, there is a possibility is that the message has been corrupted in such a way that the remainder calculated by a receiver is the same as the transmitted remainder. In other cases, both the message and the transmitted remainder may be corrupted such that the corrupted message divided by the generator yields the corrupted remainder. In these cases bad data is accepted by the receiver.

The likelihood of these occurrences may be reduced with the use of longer generator polynomials. But the use of longer polynomials increases circuit complexity in both the transmitter and receiver. Thus, these circuits benefit by incorporation of embodiments of the present invention that reduce complexity and ease timing requirements.

Figure 2:
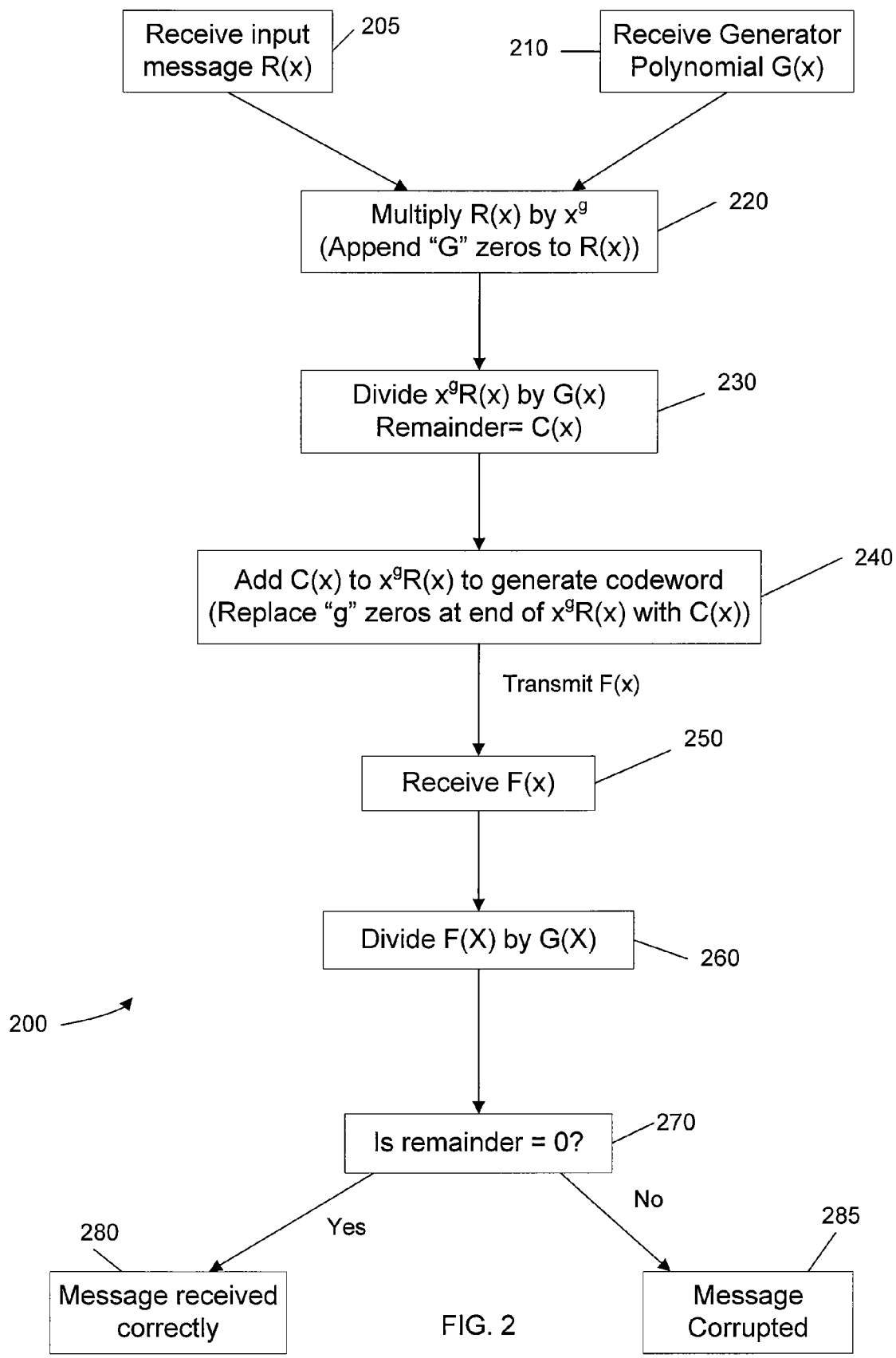
FIG. 2 is another flow chart of a method of transmitting and receiving signals that benefits by incorporation of embodiments of the present invention.

FIG. 2 is another flow chart of a method of transmitting and receiving signals that benefits by incorporation of embodiments of the present invention. In act 205, an input message R(X) is received by a transmitter. Again, this transmitter may be compliant with any one of a number of protocols. In act 210, a generator polynomial G(X) is received. In act 220, the message is multiplied by $x^g$, again this simply means that "g" zeros are appended to the message.

In act 230, the product $x^gR(X)$ is divided by the generator G(X), resulting in a quotient which may be ignored, and a remainder or syndrome C(X). In act 240, the syndrome is added to $x^gR(X)$, thus generating a codeword. In short, this means that the "g" zeros appended to $x^gR(X)$ are replaced with C(X). At this point, further processing such as interleaving may occur, and the codeword F(X) is transmitted.

In act 250, the codeword F(X) is received. In act 260, the codeword F(X) is divided by the generator polynomial G(X) resulting in a quotient, which again may be ignored, and a remainder. In act 270, it is determined whether the remainder is equal to 0. If it is, it may be assumed the message has been received correctly in act 280. If the remainder is nonzero, it is assumed the message is corrupted in act 285. Again, the corrupted message may be ignored or a retransmission may be requested.

Alternately, the syndrome C(X) may be inverted then added to $x^gR(X)$ to generate the codeword. After reception, when F(X) is divided by G(X), the remainder is all ones if there are no errors.

Figure 3:
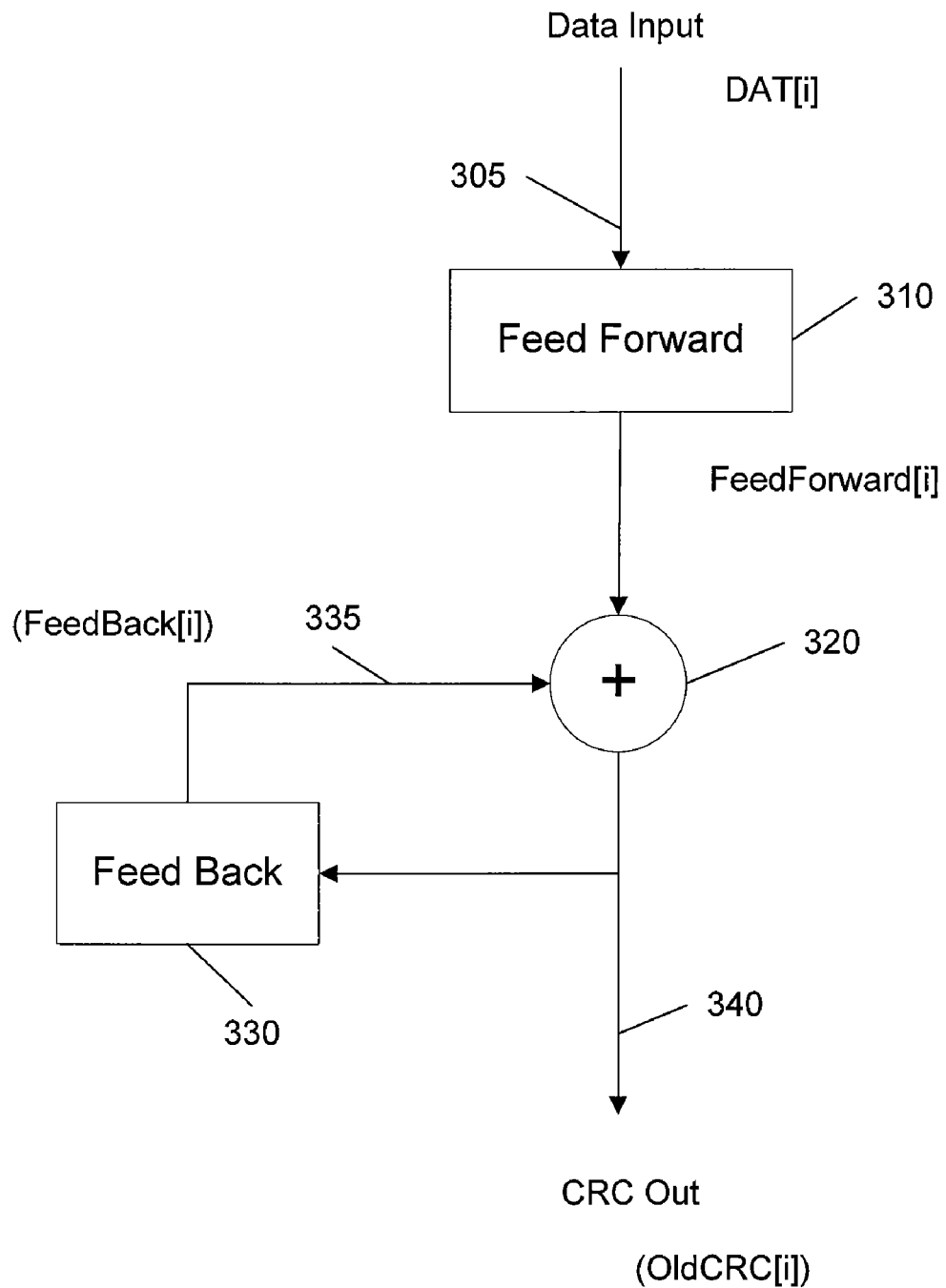
FIG. 3 is a circuit that may be used by a receiver or transmitter for calculating a CRC for an input message.

FIG. 3 is a circuit that may be used by a receiver or transmitter for calculating a CRC for an input message. For example, the circuitry of FIG. 3 may be used to implement a CRC circuit according to the methods shown in and FIG. 1 or 2. Included are feedforward circuit 310, summing node 320, and feedback circuit 330.

The forward circuit 310 receives data input bits dat[i] on line 305 and provides an output feedforward[i] to the summing node 320. Feedback circuit 330 receives the current CRC (oldcrc[i]) on line 325 and provides an output (feedback[i]) on line 335 to the summing node 320. In this way, the CRC output on line 325 may be calculated from the data input on line 305.

By way of example, a 16-bit CRC implementing the generator polynomial $X^{16}+X^{12}+X^5+1$ may be implemented using the following feedforward and feedback equations:

```
feedforward[0]<=dat[0]^dat[4];
feedforward[1]<=dat[1]^dat[5];
feedforward[2]<=dat[2]^dat[6];
feedforward[3]<=dat[3]^dat[7];
feedforward[4]<=dat[4];
feedforward[5]<=dat[0]^dat[4]^dat[5];
feedforward[6]<=dat[1]^dat[5]^dat[6];
feedforward[7]<=dat[2]^dat[6]^dat[7];
feedforward[8]<=dat[3]^dat[7];
feedforward[9]<=dat[4];
feedforward[10]<=dat[5];
feedforward[11]<=dat[6];
feedforward[12]<=dat[0]^dat[4]^dat[7];
feedforward[13]<=dat[1]^dat[5];
feedforward[14]<=dat[2]^dat[6];
feedforward[15]<=dat[3]^dat[7];
feedback[0]<=oldcrc[8]^oldcrc[12];
feedback[1]<=oldcrc[9]^oldcrc[13];
feedback[2]<=oldcrc[10]^oldcrc[14];
feedback[3]<=oldcrc[11]^oldcrc[15];
feedback[4]<=oldcrc[12];
feedback[5]<=oldcrc[8]^oldcrc[12]^oldcrc[13];
feedback[6]<=oldcrc[9]^oldcrc[13]^oldcrc[14];
feedback[7]<=oldcrc[10]^oldcrc[14]^oldcrc[15];
feedback[8]<=oldcrc[0]^oldcrc[11]^oldcrc[15];
feedback[9]<=oldcrc[1]^oldcrc[12];
feedback[10]<=oldcrc[2]^oldcrc[13];
feedback[11]<=oldcrc[3]^oldcrc[14];
feedback[12]<=oldcrc[4]^oldcrc[8]^oldcrc[12]^oldcrc[15];
feedback[13]<=oldcrc[5]^oldcrc[9]^oldcrc[13];
feedback[14]<=oldcrc[6]^oldcrc[10]^oldcrc[14]; and
feedback[15]<=oldcrc[7]^oldcrc[11]^oldcrc[15];
``` where <= is a symbol meaning "takes on the value of," which may be implemented by a D-type register, ^ is a symbol for an exclusive or operation, which is addition in Galois Field GF(2) space, dat[i] is a bit in the data input received on line 305, and oldcrc[i] is a bit of the CRC output word on line 325. The derivation of these equations can be found, for example in "Error Control Systems for Digital Communication and Storage" by Stephen B. Wicker, published by Prentice Hall, 1995.

The updated CRC can then be found by:

```
newcrc<=feedback^feedforward;
``` where the exclusive or operation is a GF(2) addition done by the summing node 320.

As can be seen from the above feedforward and feedback equations, the numbers of individual gates and their inputs needed to implement the required circuitry can become quite large as longer generator polynomials are used in an attempt to reduce the number of undetected errors. For example, in a specific 32 bit implementation, 32 gates having a total of over 900 inputs are required.

Accordingly, a specific embodiment of the present invention reduces the number of gates and associated gate delays in the feedforward path by examining the input terms used, determining common expressions in them, and using these common expressions as inputs to more than one term.

For example, if the equations:

```
feedforward[0]<dat[0]^dat[1]^dat[2]^dat[3]^dat[7];
feedforward[1]<=dat[1]^dat[2]^dat[5]^dat[7];
feedforward[2]<=dat[0]^dat[2]^dat[4]^dat[5]^dat[6]; and
feedforward[3]<=dat[0]^dat[3]^dat[5]^dat[6]^dat[7];
``` are the first four feedforward input terms in a CRC circuit, the expressions:

```
s0<=dat[1]^dat[2]^dat[7];
s1<=dat[0]^dat[5]^dat[6];
s2<=dat[0]dat[3];
s3<=dat[2]^dat[4];
s4<=dat[3]^dat[7]; and
s5<=dat[5];
``` are expressions, some of which repeat in more than one input term. The first four input terms above can then be simplified as:

```
feedforward[0]<=s0^s2;
feedforward[1]<=s0^s5;
feedforward[2]<=s1^s3; and
feedforward[3]<=s1^s5.
```

In this way, two levels of logic may be used to implement the four input terms. The logic in this example is simplified in that no gate has more than 3 inputs, and most have only two inputs. The savings become more dramatic as the expressions s0-s5 are used in more input terms. This same approach can be used by various embodiments of the present invention in the feedback path also.

Figure 4:
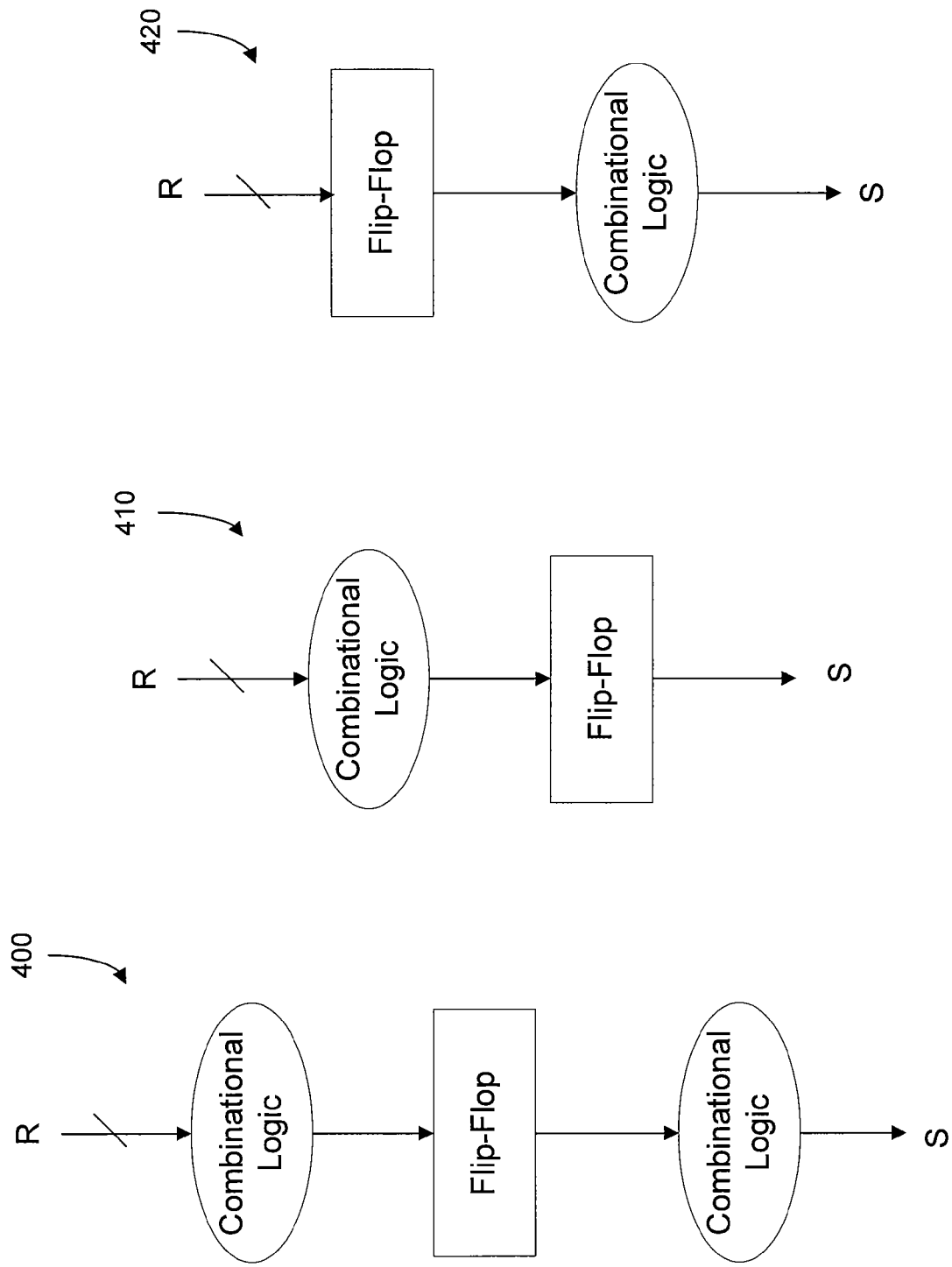
FIG. 4 illustrates a variety of architectures that may be used to implement feedforward circuits consistent with an embodiment of the present invention.

FIG. 4 illustrates a variety or architectures that may be used to implement a feedforward circuit consistent with an embodiment of the present invention. Similar architectures can be used in the feedback path as well. In example 400, an input is received by a first combinatorial logic group of circuits. This logic may implement the expressions used in various input terms as outlined above. These expressions may be stored in a group of flip-flops, and combined in the second combinatorial logic group, resulting in the feedforward terms. In example 410, the two levels of logic are combined in one logic group, the outputs of which are then stored in flip-flops. In example 420, the inputs are stored, then fed to logic circuits. The architecture chosen at least partly depends on the timing delays of surrounding circuitry and the required delay times for these circuits.

FIG. 5 illustrates several equations showing the underlying basis for a method of computing CRCs that may incorporate feedforward elements of embodiments of the present invention. Equation 500 is equal to the remainder or syndrome found, for example, in act 230 of FIG. 2. In this example, W1, W2, and W3 are received words having a length "w," while G(X) is the generator polynomial having a length "g," and the multiplying term $x^g$ has been omitted for simplicity. In a specific embodiment, "g" and "w" are equal, while in other embodiments, "g" and "w" have a different value. For example, "w" may have a larger value than "g."

The terms of equation 520 can be deconstructed into a sum of equations 505, 510, and 515, where "Z" is an all zeros word having a length of "w." If each of these included examples, words W1, W2, W3, and Z may be formed of symbols. In a specific embodiment of the present invention, the symbols are a single bit.

Accordingly, if each of the words W1, W2, and W3 are divided by the generator polynomial G(X), the remainders may be referred to as S1, S2, and S3 as in equations 530, 540, and 550. From this, the remainders may be substituted for each of the words, as shown in equations 560 and 565. The same deconstruction can be used such that equation 590 is split into a sum of equations 570, 575, and 580.

From these last three equations, it can be seen that a method of division can be used in generating a CRC, where previously found remainders are combined with new remainders and divided by the generator poynomial to determine the CRC for a message.

Figure 6:
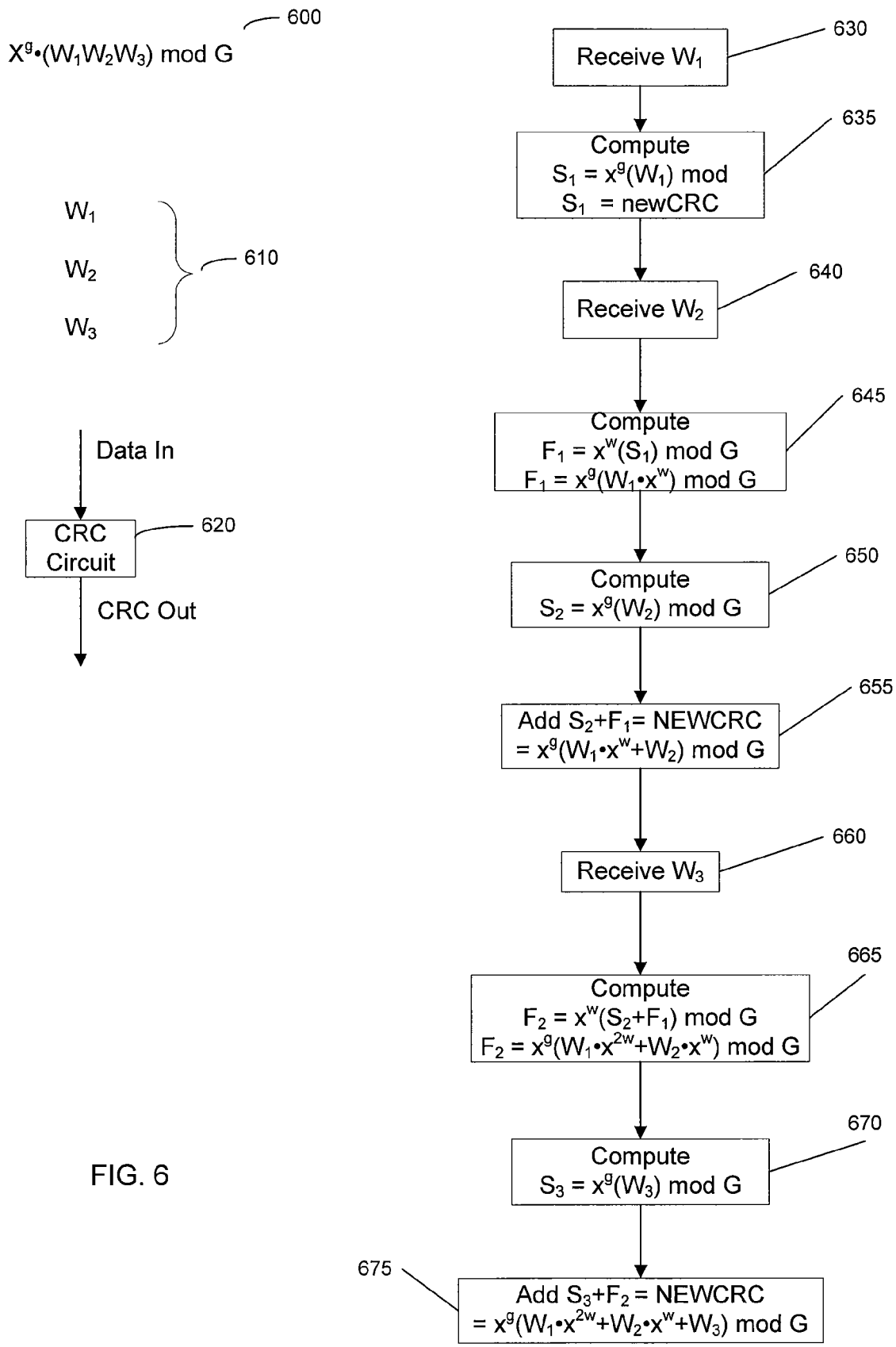
FIG. 6 is a flow chart of a method of computing CRCs that may incorporate feedforward elements of embodiments of the present invention.

FIG. 6 is a flow chart of a method of computing CRCs that may incorporate feedforward elements of embodiments of the present invention. The flow chart of FIG. 6 makes use of the equations shown in FIG. 5. The CRC circuit 620 receives the words 610 at its data input, and provides CRC bits as an output. The following method may be used by the CRC circuit 620 to determine the remainder in equation 600, where the remainder is used as the CRC bits. In equation 600, W1, W2, and W3 are received data, while the factor $x^g$ is shown separately.

In act 630, the first data word W1 is received. In act 635, $x^g R(X)$ is divided by G(X), where R(X) is simply W1. This remainder is the CRC if no additional data words are received. However, in act 640, a new data word W2 is received. Accordingly, in act 645, F1 is computed, where F1=$x^w R(X)$modG, where R(X) is equal to S1, and where "w" is the length of the received words W1, W2, and W3. In act 650, S2 is computed, where S2=$x^g R(X)$modG, and R(X)=W2. S2 and F1 are summed, resulting in a new CRC, in act 655. This is the CRC value if no further data words in this message are received by the CRC circuit 620. Again, however, in act 660, a new data word W3 is received. Accordingly, F2 is computed in act 665, where F2=$x^g R(X)$modG, where R(X) is the sum of F1 and S2. In act 670, S3 is computed, where F2=$x^g R(X)$modG, and R(X)=W3. S3 and F2 are summed, resulting in a new CRC value in act 675. Again, if no new data words are received, this is the CRC for the received message.

Figure 7:
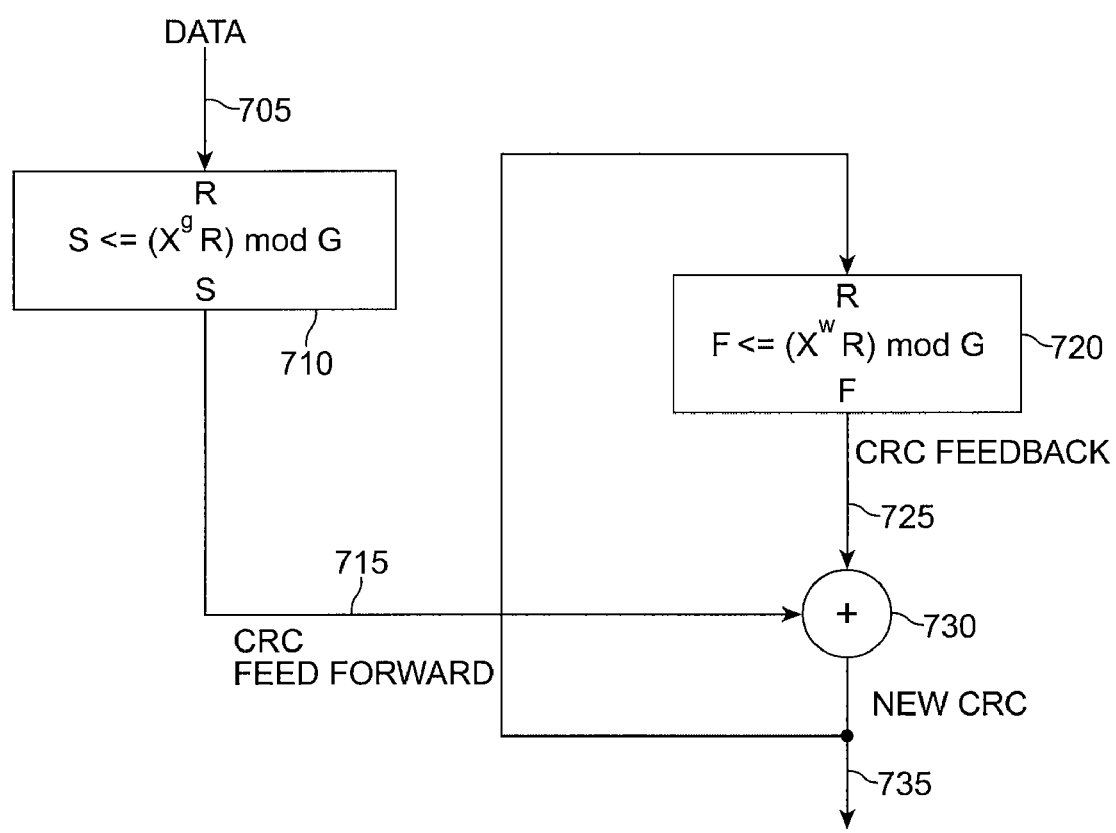
FIG. 7 is a block diagram of a circuit that implements the flow chart of FIG. 6.

FIG. 7 is a block diagram of a circuit that implements the flow chart of FIG. 6. Included are a feedforward circuit 710, feedback circuit 720, and summing node 730. Data is received on line 705 by the feedforward circuit 710, and CRC values are provided at the summing node output on line 735. In each of the included figures, these lines are typically buses, for example 32, 64, 128, 256, or more bits in width. In other embodiments, the bus widths may be less than 32 bits.

On each clock cycle, a data word is received by feedforward circuit 710. Feedforward circuit 710 multiplies the received data word by $x^g$ and divides by the generator polynomial G(X), and stores the remainder as S. These values of S are output on the CRC feedforward lines 715 to the summing node 730.

At the same time, the previous value of CRC is fed back to the feedback circuit 720. Feedback circuit 720 multiplies the previous CRC value by $x^w$ and divides by the generator polynomial G(X), and stores the remainder as F. Each clock cycle the new value of F is output by the feedback circuit on line 725, where it is summed with the CRC feedforward terms on line 715 by the summing node 730, and provided as the new CRC value on line 735.

The timing constraints for this circuit are fairly severe. The feedforward path may be arbitrarily pipelined, at least to the extent that CRC values are required by other transmitting or receiving circuitry. However, the feedback path must complete its operation in one clock cycle, such that a feedback term is available for the corresponding CRC feedforward terms on line 715. Accordingly, in order to ease and mitigate these timing constraints, embodiments of the present invention pipeline the feedback stage such that the feedback path has two or more clock cycles in which to complete its operation.

Figure 8:
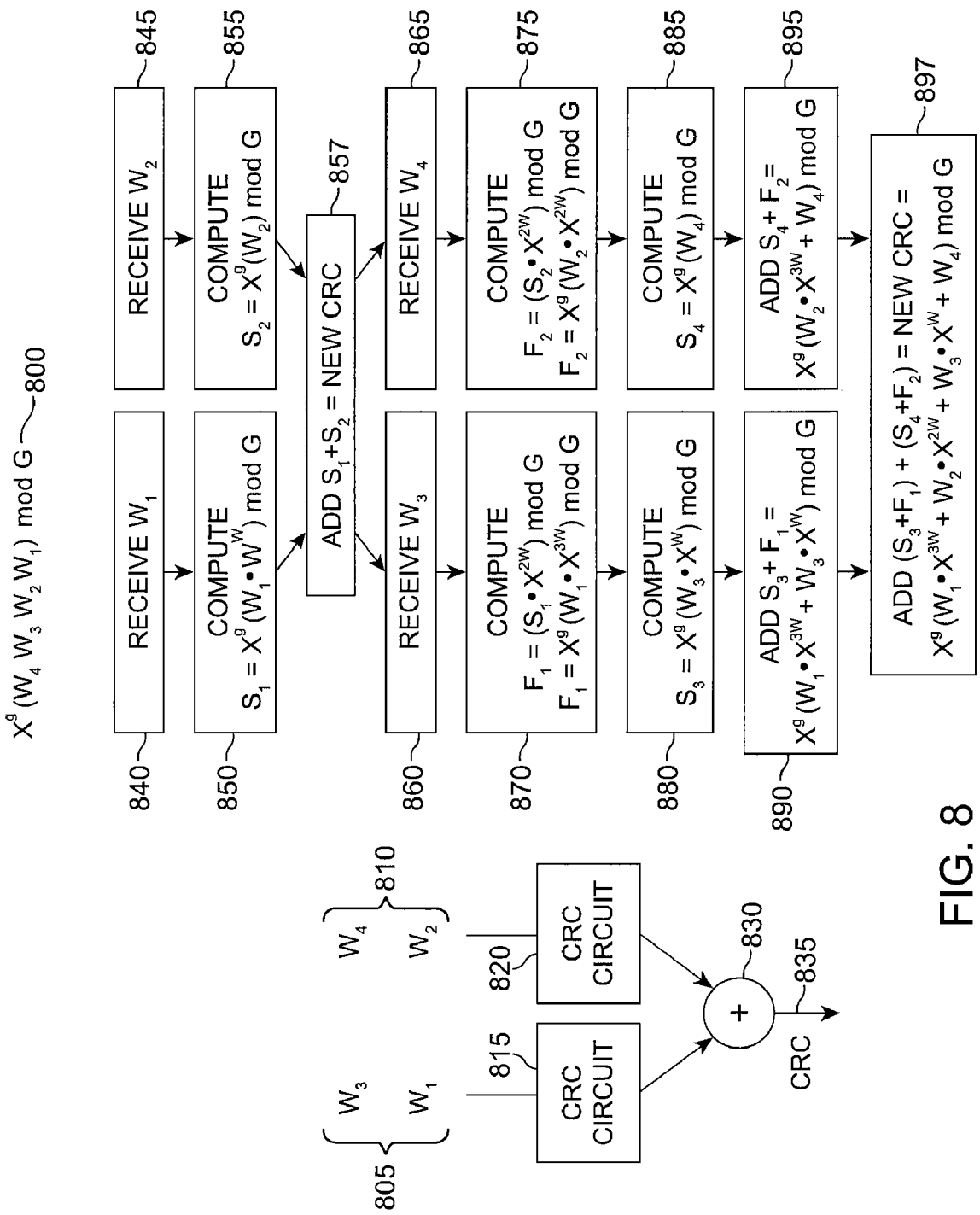
FIG. 8 is a flow chart of a method of calculating CRCs that is consistent with an embodiment of the present invention.

FIG. 8 is a flow chart of a method of calculating CRCs that is consistent with an embodiment of the present invention. Specifically, this flow chart provides parallel CRC circuits operating on alternating data words such that each feedback path has two clock cycles in which to complete its computations. It will be appreciated by one skilled in the art that this concept may be expanded to more than two CRC circuits operating parallel.

CRC circuits 815 and 820 receive alternating data words 805 and 810. The outputs of the CRC circuits are summed by summing node 830 which provides a CRC output on line 835.

In act 840, a first CRC circuit receives W1. In act 850, the remainder S1, which is the remainder of W1 times $x^{g+w}$ divided by the generator G(X), is stored. On the next clock cycle, word W2 is received by the second CRC circuit, and in act 855 the remainder S2, which is the remainder of W1 times $x^g$ divided by the generator G(X), is stored. In act 857, S1 and S2 are summed and provided as the CRC output. If no further data words are received by either CRC circuit, the sum S1 and S2 is the CRC for the received message.

However, in this specific example, in act 860, on the third clock cycle, word W3 is received by the first CRC circuit. Accordingly, F1, where $F1=(S1x^{2w})\bmod G$, is computed. At or about the same time, in act 880, S3, where $S3=x^g R(X)\bmod G$, and R(X)=W3 is computed. On the next clock cycle, W4 is received by the second CRC circuits, and F2 is computed in act 875, where $F2=(S2x^{2w})\bmod G$. At or about the same time, S4, where $S4=x^g R(X)\bmod G$, and R(X)=W4 is computed. During the following clock cycle, S3 and F1 are summed and S4 and F2 are summed, in acts 890 and 895. In act 897, these sums are added together to form an updated CRC value. This value is the CRC as determined by equation 800.

Figure 9:
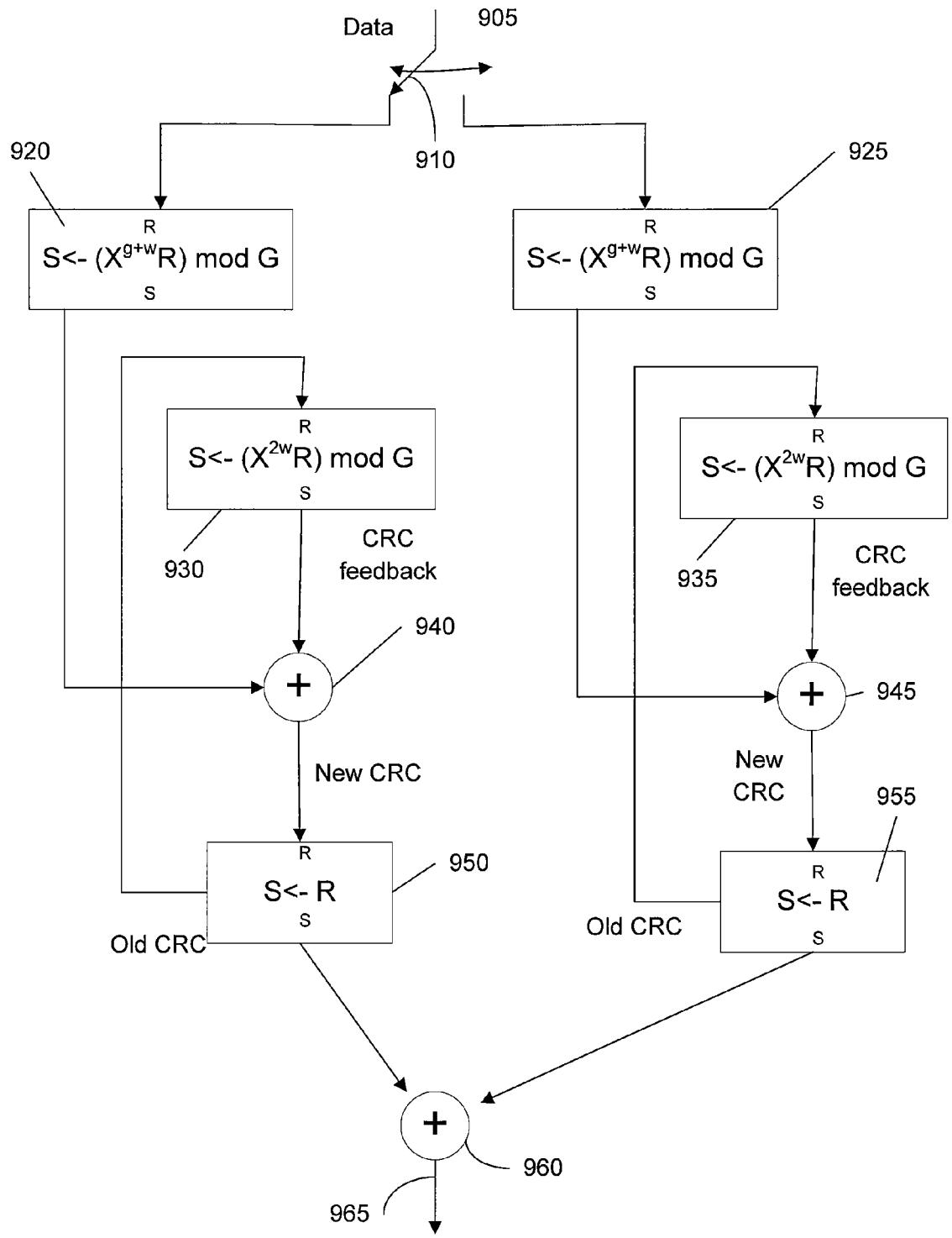
FIG. 9 is a block diagram of a circuit that implements the flow chart of FIG. 8.

FIG. 9 is a block diagram of a circuit that implements the flow chart of FIG. 8. Included are a first CRC circuit including feedforward circuit 920, a feedback path including feedback circuit 930 and delay circuit 950, and summing node 940, and a second CRC circuit including feedforward circuit 925, and a feedback path including feedback circuit 935 and delay circuit 955, and summing node 944. The inputs to the first and second CRC circuits are received on line 905 and switched by switch 910. When the switch 910 is open, an all zeros word is received by feedforward circuits 920 and 925. The outputs of the first and second CRC circuits are summed by summing node 960, and output CRC values are provided on line 965.

In this figure, each of the feedforward, feedback, and delay circuits have one clock cycle to process to data. Thus, in practical implementations, the feedback and delay circuits can be combined into one circuit having two clock cycles in which to complete its operation.

As can be seen, the included circuitry is highly redundant. Accordingly, other embodiments of the present invention apply properties of Galois Field mathematics in order to combine these first and second CRC circuits.

FIG. 10 illustrates several equations showing the underlying basis for a method of computing CRCs that may incorporate embodiments of the present invention. These equations may be used to simplify the circuitry shown in FIG. 9. Similar to before, equation 1025 can be deconstructed into equations 1015 and 1020. Accordingly, if the remainder of each of the input words divided by the generator polynomial are the remainders as shown in equations 1030, 1035, and 1040, then equations 1045 and 1050 can summed together resulting in equation 1055. This principle can be applied to a method of computing CRC values according to an embodiment of the present invention.

Figure 11:
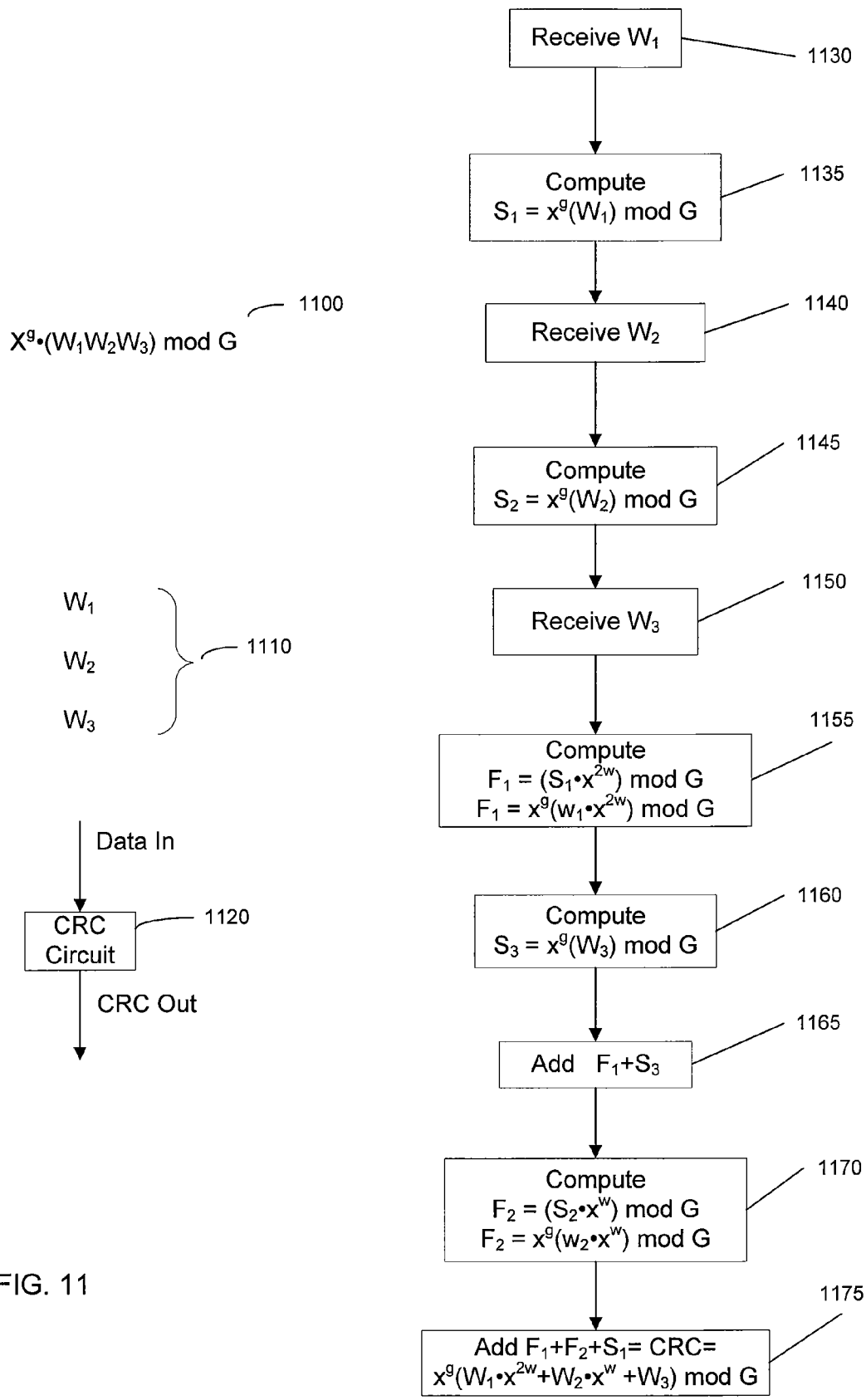
FIG. 11 is a flow chart of a method of calculating CRCs that is consistent with an embodiment of the present invention and which utilizes the equations of FIG. 10.

FIG. 11 is a flow chart of a method of calculating CRCs that is consistent with an embodiment of the present invention and which utilizes the equations of FIG. 10. As before, data is received by CRC circuits 1120, and CRC output values provided. Data words 1110 are received in sequence W1, W2, and W3. Accordingly, the remainder identified in equations 1100 is computed.

In act 1130, W1 is received by the CRC circuit 1120. Accordingly, in act 1135, S1 is computed where $S1=x^g R(x)\bmod G$, and R(x)=W1. If no further data words are received, S1 is CRC for the received message. In act 1140, W2 is received by the CRC circuit 1120. Accordingly, S2 is computed where $S2=x^g R(x)\bmod G$, and R(x)=W2. The feedback term is not required yet, thus the CRC circuit may take an additional clock cycle in which to compute it.

In act 1150, W3 is received by the CRC circuit 1120. At this time, the feedback term F1 is needed and its computation is completed in act 1155, where $F1=(S1x^{2w})\bmod G$. S3 is computed in act 1160, where $S3=X^g R(x)\bmod G$, and R(x)=W3. In act 1165, F1 and S3 are summed resulting in S5. In act 1170, F2 is computed, where $F2=(S1x^w)\bmod G$. In act 1175 F1, F2, and S1 are summed, resulting in the CRC value identified by equation 1100.

Figure 12:
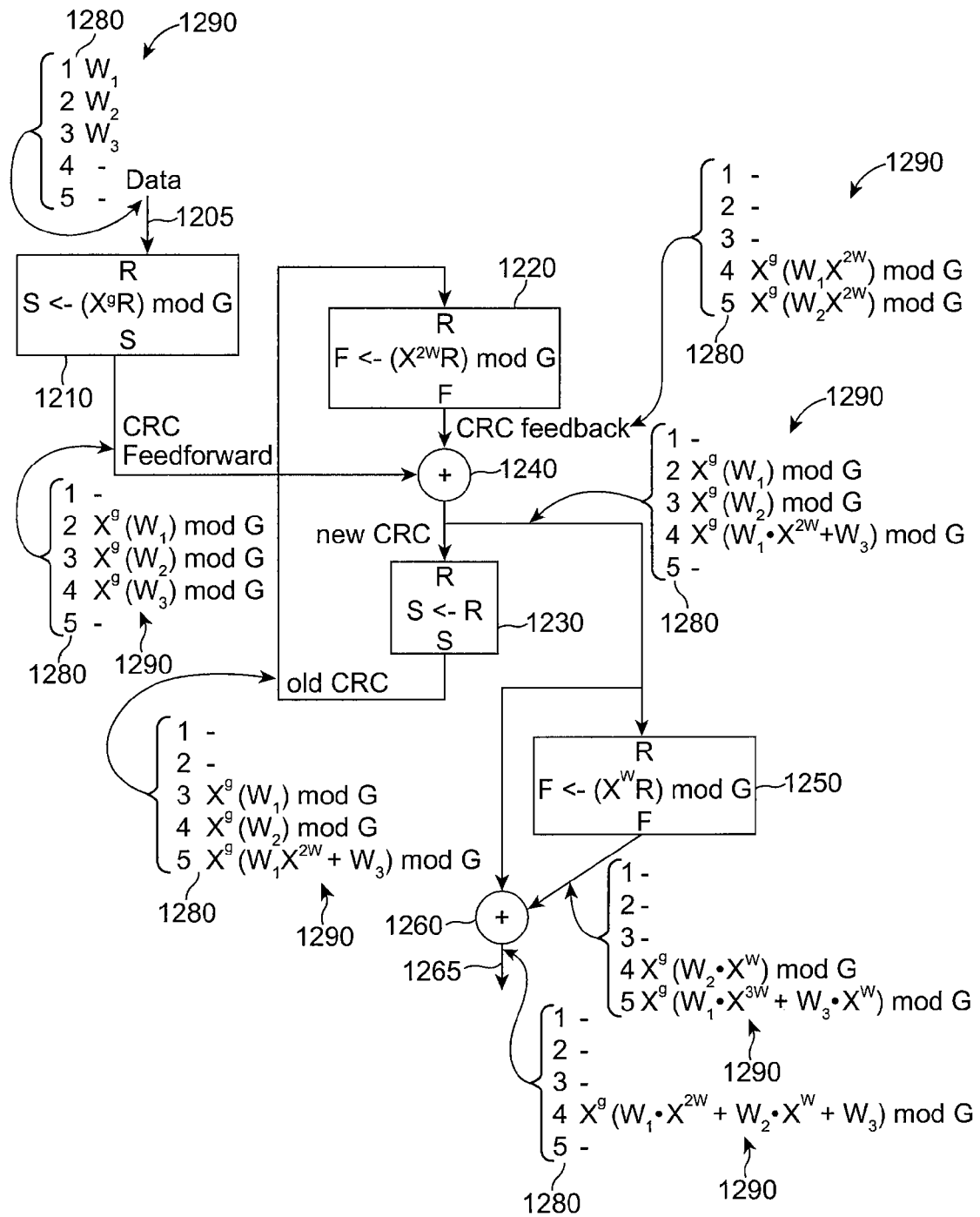
FIG. 12 is a block diagram of a circuit that implements the flow chart of FIG. 11.

FIG. 12 is a block diagram of a circuit that implements the flow chart of FIG. 11. Included are feedforward circuit 1210, feedback circuit 1220, summing node 1240, delay circuit 1230, remainder generator circuit 1250, and output summing node 1260. Data is received on line 1205, and CRC output values are provided by the output summing node on line 1265.

Again, each of these circuits, such as feedforward circuit 1210, feedback circuit 1220, delay circuit 1230, and remainder generator circuit 1250, complete their operations in one clock cycle. The feedback path including delay circuit 1230 and feedback circuit 1220 has two clock cycles in which to complete its operation before a new CRC feedback value is required at the summing node 1240. In this way, the timing constraints of the feedback path are alleviated.

Figure 13:
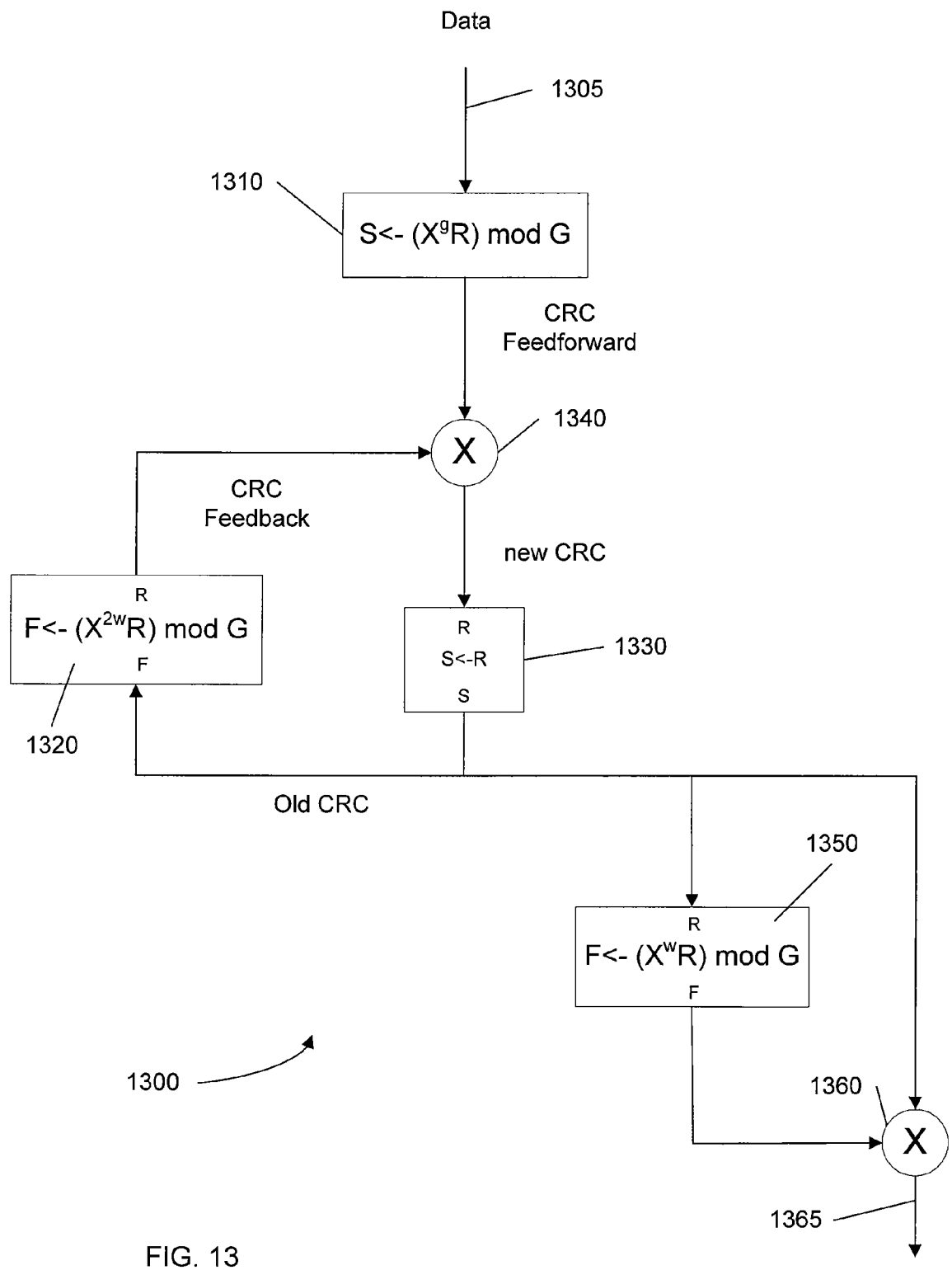
FIG. 13 is another block diagram of a circuit that implements the flow chart of FIG. 11.

For each node, a list is provided showing the state of the node 1290 at each of one of five clock cycles 1280. A dash indicates that the state at that node is not important to the determination of the CRC for the received message W1W2W3. In particular, W1 is received at a first clock, W2 at a second, and W3 at a third. The final CRC for this received message is found at the fourth clock cycle at the output of the summing node FIG. 13 is another block diagram of a circuit that implements the flow chart of FIG. 11. Included are feedforward circuit 1310, feedback circuit 1320, summing node 1340, delay circuit 1330, remainder generator circuit 1350, and output summing node 1360. Data is received on input line 1305, and CRC values are provided by the output summing node 1360 on line 1365.

Figure 14:
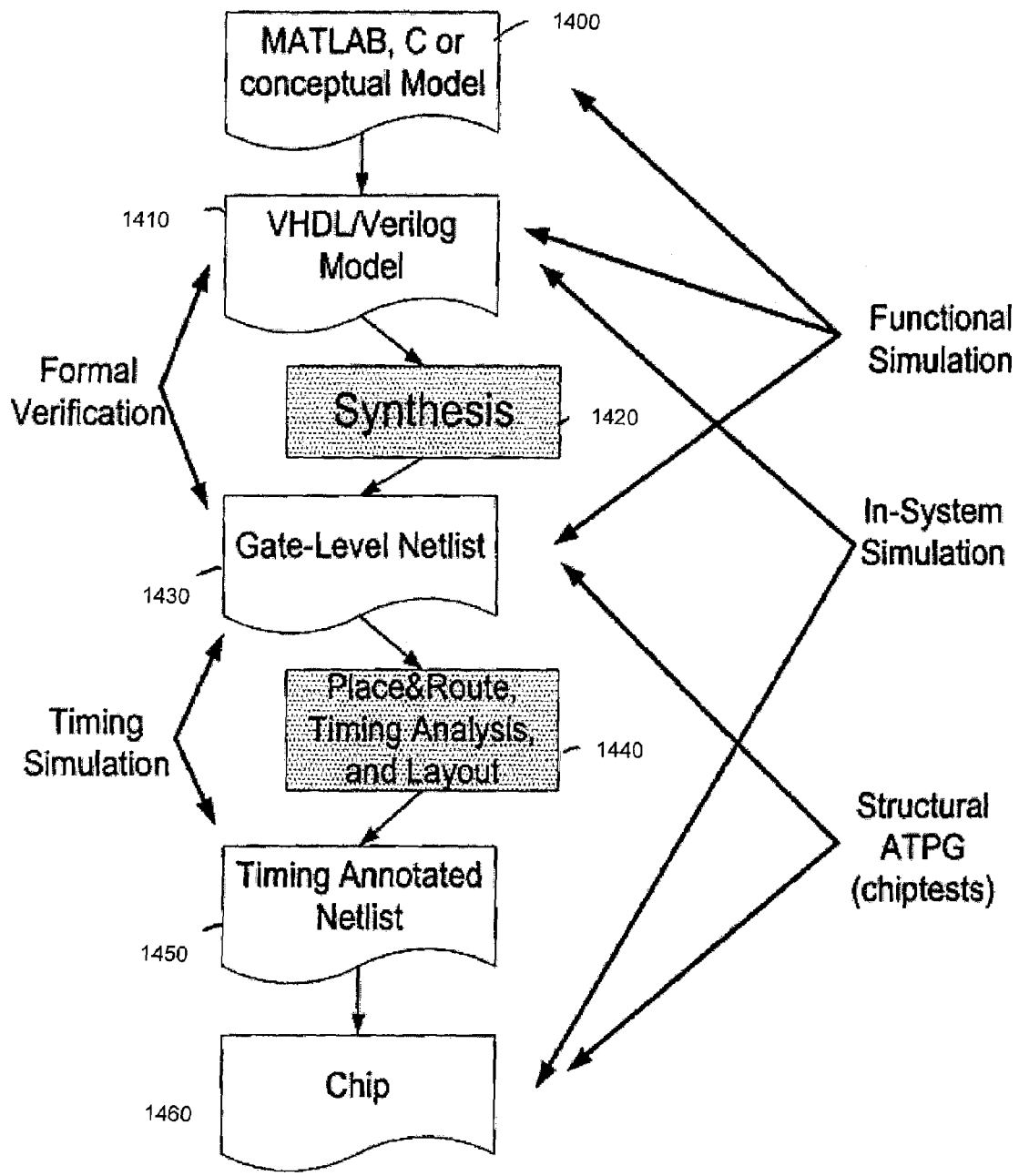
FIG. 14 is a flow chart showing the acts in a design process that may benefit by the use of embodiments of the present invention.

FIG. 14 is a flow chart showing the acts in a design process that may benefit by the use of embodiments of the present invention. This flow may be used in the design of an integrated circuit such as a programmable logic device. To begin, a Matlab, C, conceptual, or other model file 1400 is generated. This model 1400 is a logical representation of a function to be performed by a final integrated circuit or integrated circuit portion. Representations of CRC circuits consistent with embodiments of the present invention can be used to simplify the model file, since they can replace complex functions. From this, a VHDL, Verilog, AHDL (Altera hardware description language), or other HDL model 1400 (referred to as simply a VHDL or Verilog model) is generated. Alternately, the VHDL or Verilog model may be generated directly, skipping generation of the model file 1400. This model is synthesized in act 1420 to generate a gate level netlist 1400. For PLDs the VHDL or Verilog model 1410 is converted to a non-optimized gate level netlist, made up of gate level logic functions such as OR, NAND, and other gates, as well as flip-flops, latches, pass gates, multiplexers, and other logic functions. This non-optimized netlist is "optimized," that is, improved or simplified, by the synthesizer. The optimized netlist undergoes a process referred to as technology mapping. For example, logic gates may be converted to look-up tables, product terms, or similar functions, particularly if the end integrated circuit is an FPGA or PLD. The conversion of the VHDL or Verilog model 1400 to a gate level netlist 1400 may be referred to as synthesis or formal verification.

The gate level netlist 1400 is then fitted to an integrated circuit layout, for example, by using a place and route program. The physical locations of the gates, and other information such as routing distances are determined in act 1440. From this, parasitic extraction is performed, and a timing simulation using embodiments of the present invention is run.

The output of the timing simulation, or timing extraction, can be used to generate an annotated netlist 1450. This netlist is used to generate the final integrated circuit 1460. The integrated circuit 1460 may be a programmable logic device, a field programmable gate array, or other integrated circuit. The present invention may alternately be implemented in software, such as in a digital signal processor (DSP) formed in microcode, firmware, or implemented in some other manner.

Figure 15:
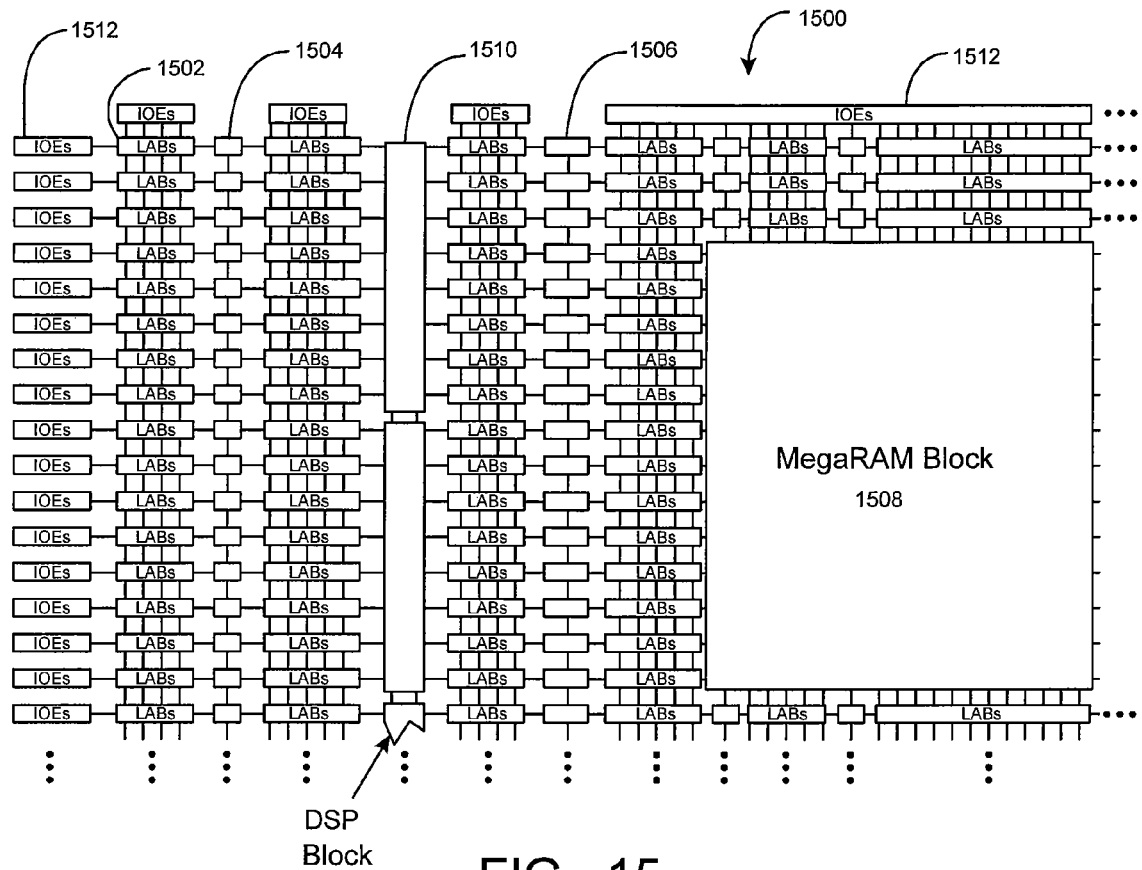
FIG. 15 is a simplified block diagram of a programmable logic device that can implement embodiments of the present invention.

FIG. 15 is a simplified partial block diagram of an exemplary high-density programmable logic device 1500 wherein techniques according to the present invention can be utilized. PLD 1500 includes a two-dimensional array of programmable logic array blocks (or LABs) 1502 that are interconnected by a network of column and row interconnects of varying length and speed. LABs 1502 include multiple (e.g., 10) logic elements (or LEs), an LE being a small unit of logic that provides for efficient implementation of user defined logic functions.

PLD 1500 also includes a distributed memory structure including RAM blocks of varying sizes provided throughout the array. The RAM blocks include, for example, 512 bit blocks 1504, 4K blocks 1506 and a MegaBlock 1508 providing 512K bits of RAM. These memory blocks may also include shift registers and FIFO buffers. PLD 1500 further includes digital signal processing (DSP) blocks 1510 that can implement, for example, multipliers with add or subtract features. I/O elements (IOEs) 1512 located, in this example, around the periphery of the device support numerous single-ended and differential I/O standards. It is to be understood that PLD 1500 is described herein for illustrative purposes only and that the present invention can be implemented in many different types of PLDs, FPGAs, and the like. CRC circuits consistent with embodiments of the present invention can be formed from several LABs 1502. Alternately, these CRC circuits can be found in DSP blocks 1510, or other portion of PLD 1500. These circuits may be formed by being programmed, or they may be dedicated, hand-wound, circuit patterns on the integrated circuit.

Figure 16:
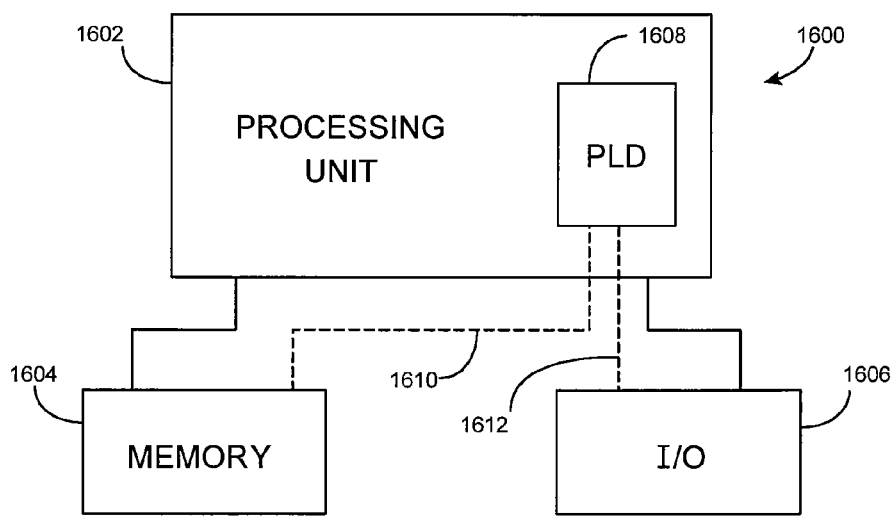
FIG. 16 is a block diagram of an electronic system that may incorporate embodiments of the present invention.

While PLDs of the type shown in FIG. 16 provide many of the resources required to implement system level solutions, the present invention can also benefit systems wherein a PLD is one of several components. FIG. 16 shows a block diagram of an exemplary digital system 1600, within which the present invention may be embodied. System 1600 can be a programmed digital computer system, digital signal processing system, specialized digital switching network, or other processing system. Moreover, such systems may be designed for a wide variety of applications such as telecommunications systems, automotive systems, control systems, consumer electronics, personal computers, Internet communications and networking, and others. Further, system 1600 may be provided on a single board, on multiple boards, or within multiple enclosures.

System 1600 includes a processing unit 1602, a memory unit 1604 and an I/O unit 1606 interconnected together by one or more buses. According to this exemplary embodiment, a programmable logic device (PLD) 1608 is embedded in processing unit 1602. PLD 1608 may serve many different purposes within the system in FIG. 16. PLD 1608 can, for example, be a logical building block of processing unit 1602, supporting its internal and external operations. PLD 1608 is programmed to implement the logical functions necessary to carry on its particular role in system operation. PLD 1608 may be specially coupled to memory 1604 through connection 1610 and to I/O unit 1606 through connection 1612.

Processing unit 1602 may direct data to an appropriate system component for processing or storage, execute a program stored in memory 1604 or receive and transmit data via I/O unit 1606, or other similar function. Processing unit 1602 can be a central processing unit (CPU), microprocessor, floating point coprocessor, graphics coprocessor, hardware controller, microcontroller, programmable logic device programmed for use as a controller, network controller, and the like. Furthermore, in many embodiments, there is often no need for a CPU.

For example, instead of a CPU, one or more PLD 1608 can control the logical operations of the system. In an embodiment, PLD 1608 acts as a reconfigurable processor, which can be reprogrammed as needed to handle a particular computing task. Alternately, programmable logic device 1608 may itself include an embedded microprocessor. Memory unit 1604 may be a random access memory (RAM), read only memory (ROM), fixed or flexible disk media, PC Card flash disk memory, tape, or any other storage means, or any combination of these storage means.

The above description of exemplary embodiments of the invention has been presented for the purposes of illustration and description. It is not intended to be exhaustive or to limit the invention to the precise form described, and many modifications and variations are possible in light of the teaching above. The embodiments were chosen and described in order to best explain the principles of the invention and its practical applications to thereby enable others skilled in the art to best utilize the invention in various embodiments and with various modifications as are suited to the particular use contemplated.

What is claimed is:

1. A method of computing cyclical redundancy check bits for a message comprising:
   receiving a first word of the message, the first word comprising N message bits;
   computing a plurality of feedforward bits for the first word by:
      logically combining message bits of K groups of the N message bits to form K logical expressions, wherein K and N are integers,
      combining the K logical expressions into a plurality of terms, and
      storing the plurality of terms as a plurality of feedforward bits;
   providing the plurality of feedforward bits to a first logic circuit;
   providing a plurality of cyclical redundancy check bits using the first logic circuit;
   providing a plurality of feedback bits for the plurality of cyclical redundancy check bits using a feedback circuit; and
   providing the plurality of feedback bits to the first logic circuit,
   wherein the first logic circuit is a summing circuit, and wherein the feedback circuit is pipelined such that it receives an input and provides a corresponding output two clock cycles later.

2. The method of claim 1 wherein the summing circuit provides an exclusive-or function.

3. A method of computing cyclical redundancy check bits for a message comprising:
   receiving a first word of the message, the first word comprising a plurality of message bits;
   computing a plurality of feedforward bits for the first word using a feedforward circuit, wherein the feedforward circuit receives the first word and provides the plurality of feedforward bits after N clock cycles;
   providing the plurality of feedforward bits to a first logic circuit;
   providing a plurality of cyclical redundancy check bits using the first logic circuit;
   providing a plurality of feedback bits for the plurality of cyclical redundancy check bits using a feedback circuit, wherein the feedback circuit receives the plurality of cyclical redundancy check bits and provides the plurality of feedback bits after 2N clock cycles; and
   providing the plurality of feedback bits to the first logic circuit.

4. The method of claim 3 wherein N is equal to one.

5. An integrated circuit comprising:
   a circuit to receive a message and provide a plurality of cyclical redundancy check bits comprising:
      a feedforward circuit; and
      a feedback circuit, where an output of the feedforward circuit and an output of the feedback circuit are coupled to a logic circuit, wherein an output of the logic circuit provides the cyclical redundancy check bits, and
   wherein the feedforward circuit comprises a first plurality of logic gates coupled to receive the message and provide outputs to a second plurality of logic gates,
   wherein at least one of the first plurality of logic gates couple couples to at least two of the second plurality of logic gates, the feedforward circuit receives message bits and provides an output to the logic circuit after N clock cycles, and the feedback circuit receives the cyclical redundancy check bits and provides an output to the logic circuit after 2N clock cycles.

6. The integrated circuit of claim 5 wherein the logic circuit is a summing circuit.

7. The integrated circuit of claim 6 wherein the summing circuit provides an exclusive-or function.

8. The integrated circuit of claim 7 further comprising a plurality of flip-flops coupled to provide outputs to the first plurality of logic gates.

9. The integrated circuit of claim 7 further comprising a plurality of flip-flops coupled to receive inputs from the first plurality of logic gates and provide outputs to the second plurality of logic gates.

10. The integrated circuit of claim 7 further comprising a plurality of flip-flops coupled to receive outputs from the second plurality of logic gates.

11. A receiver for use in data networks comprising an integrated circuit, the integrated circuit comprising:
    a first circuit to receive words in a data message, wherein each word is a first number of bits in length;
    a first summing node to receive an output from the first circuit;
    a second circuit to receive an output from the first summing node and provide an output to the first summing node;
    a third circuit coupled to receive an output from the first summing node; and
    a second summing node to receive an output from the first summing node, an output from the third circuit, and provide a plurality of cyclical redundancy check bits.

12. The receiver of claim 11 wherein the first circuit left shifts each input word by a second number of bits, divides the result by a generator, and provides the remainder as an output.

13. The receiver of claim 12 wherein the second circuit left shifts each input word by twice the first number of bits, divides the result by a generator, and provides the remainder as an output.

14. The receiver of claim 13 wherein the third circuit left shifts each input word by the first number of bits, divides the result by a generator, and provides the remainder as an output.

15. The receiver of claim 14 wherein the first summing node and the second summing node provide an exclusive-OR function.

16. The receiver of claim 14 wherein the first circuit left shifts each input word by a second number of bits, divides the result by a generator, and provides the remainder as an output each third number of clock cycles and the second circuit left shifts each input word by twice the first number of bits, divides the result by a generator, and provides the remainder as an output each fourth number of clock cycles, wherein the fourth number is twice the third number.

17. The receiver of claim 16 wherein the fourth number is two and the third number is one.

18. The receiver of claim 16 wherein the first number is 32.

* * * * *